United States Patent
Dong et al.

(10) Patent No.: US 10,191,101 B2
(45) Date of Patent: Jan. 29, 2019

(54) SYSTEM AND METHOD FOR DETECTING GROUND FAULT IN A DC SYSTEM

(71) Applicant: General Electric Company, Schenectady, NY (US)

(72) Inventors: Dong Dong, Schenectady, NY (US); Yan Pan, Niskayuna, NY (US); Rixin Lai, San Jose, CA (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 908 days.

(21) Appl. No.: 14/556,744

(22) Filed: Dec. 1, 2014

(65) Prior Publication Data

US 2016/0154046 A1  Jun. 2, 2016

(51) Int. Cl.
*G01R 31/08* (2006.01)
*G01R 31/02* (2006.01)
*G01R 31/00* (2006.01)

(52) U.S. Cl.
CPC ......... *G01R 31/025* (2013.01); *G01R 31/008* (2013.01); *G01R 31/08* (2013.01)

(58) Field of Classification Search
CPC .... G01R 31/025; G01R 31/008; G01R 31/08; G01R 31/02
See application file for complete search history.

(56) References Cited

U.S. PATENT DOCUMENTS

| | | | |
|---|---|---|---|
| 3,700,967 A | 10/1972 | Hoss | |
| 3,840,783 A | 10/1974 | Eckart | |
| 4,344,100 A | 8/1982 | Davidson et al. | |
| 4,638,245 A | 1/1987 | MacPhee et al. | |
| 6,856,137 B2 | 2/2005 | Roden et al. | |
| 7,969,696 B2 | 6/2011 | Lazarovich et al. | |

(Continued)

FOREIGN PATENT DOCUMENTS

| | | |
|---|---|---|
| CN | 102830283 A | 12/2012 |
| WO | 2009020372 A1 | 2/2009 |

OTHER PUBLICATIONS

Baldwin et al., "Fault Locating in Ungrounded and High-Resistance Grounded Systems", Industrial and Commercial Power Systems Technical Conference, 2001. Conference Record. Papers Presented at The 2001 Annual Meeting. 2001 IEEE, May, 2001, pp. 163-169.

(Continued)

*Primary Examiner* — Alesa Allgood
*Assistant Examiner* — Brent J Andrews
(74) *Attorney, Agent, or Firm* — GE Global Patent Operation; Nitin Joshi

(57) ABSTRACT

A ground fault detection system for locating a ground fault in a direct current (DC) power transfer system is provided. The system includes a ground fault detection component and a current sensor. The ground fault detection component includes a first switch and a first resistive element electrically coupled to each other in a series configuration. The ground fault detection component also includes a second switch and a second resistive element electrically coupled to each other in a series configuration. Furthermore, the current sensor is operatively coupled to a load and is configured to measure a fault current at the load upon switching at least one of the first switch or the second switch to a conducting state.

16 Claims, 6 Drawing Sheets

(56) References Cited

U.S. PATENT DOCUMENTS

| | | |
|---|---|---|
| 8,067,942 B2 | 11/2011 | Pan et al. |
| 8,373,420 B2 | 2/2013 | Lupaczyk et al. |
| 8,433,528 B2 | 4/2013 | Winterhalter et al. |
| 8,467,160 B2 | 6/2013 | West |
| 8,531,804 B2 | 9/2013 | Weems et al. |
| 8,564,916 B2 | 10/2013 | Kazemi et al. |
| 8,659,857 B2 | 2/2014 | Gandolfi |
| 8,696,504 B2 | 4/2014 | Yang |
| 8,698,504 B2 | 4/2014 | Wei et al. |
| 2011/0199223 A1* | 8/2011 | Akimov ............... G01R 31/025 340/636.1 |
| 2012/0014020 A1* | 1/2012 | Lehmann ............. G01R 31/025 361/42 |
| 2013/0027077 A1* | 1/2013 | Oughton, Jr. .......... G01R 31/40 324/764.01 |
| 2014/0084935 A1* | 3/2014 | Chatroux ............... G01R 27/18 324/503 |

OTHER PUBLICATIONS

European Search Report and Written Opinion issued in connection with corresponding EP Application No. 5197186.8 dated May 17, 2016.

* cited by examiner

SYSTEM AND METHOD FOR DETECTING GROUND FAULT IN A DC SYSTEM

BACKGROUND

The invention generally relates to direct current systems and, more particularly, to a system and method for detecting ground fault in the direct current systems.

Direct current (DC) power transfer systems are becoming increasing popular over alternating current (AC) power transfer systems for transmitting power in various applications. One such application includes marine applications, which may further include marine ship building and propulsion systems for marine applications. The DC power transfer systems are being employed by ship owners over the AC power transfer systems as the DC power transfer systems have multiple advantages over the AC power transfer systems. Some of the advantages may include for example, better efficiency, lower emissions, lower noise levels, and higher availability.

However, currently available DC power transfer systems have limitations in detecting ground faults occurring in the DC power transfer systems. Conventional DC power transfer systems employ a grounding mechanism which includes a plurality of resistors and a plurality of capacitors coupled to a power source in parallel. The plurality of resistors and the plurality of capacitors help in providing a ground reference voltage and stabilizing the ground reference voltage respectively. Although, upon occurrence of a fault at a load, the plurality of capacitors are discharged via a ground loop, which generates a pulse current. The grounding mechanism employed in the conventional DC power transfer systems is unable to detect such pulse current, which leads to undesirable results.

Hence, there is a need for an improved system and method for detecting the ground fault in the DC power transfer systems.

BRIEF DESCRIPTION

Briefly, in accordance with one embodiment, a ground fault detection system for locating a ground fault in a direct current (DC) power transfer system is provided. The ground fault detection system includes a ground fault detection component and a current sensor. The ground fault detection component includes a first switch and a first resistive element electrically coupled to each other in a series configuration. The ground fault detection component also includes a second switch and a second resistive element electrically coupled to each other in a series configuration. Furthermore, the current sensor is operatively coupled to a load and is configured to measure a fault current at the load upon switching at least one of the first switch or the second switch to a conducting state.

In another embodiment, a direct current (DC) power transfer system is provided. The DC power transfer system includes a power source configured to provide DC power, a DC bus configured to transmit DC power from the power source, at least one load operatively coupled to the DC bus, and a ground fault detection system operatively coupled to the DC bus. The ground fault detection system includes a ground fault detection component and at least one current sensor. The ground fault detection component includes a first switch and a first resistive element electrically coupled to each other in a series configuration. The ground fault detection component also includes a second switch and a second resistive element electrically coupled to each other in a series configuration. Furthermore, the at least one current sensor is operatively coupled to at least one load and is configured to measure a fault current at the at least one load upon switching at least one of the first switch or the second switch to a conducting state.

In yet another embodiment, a method for detecting and locating a ground fault in a DC power transfer system is provided. The method includes identifying a ground fault in a DC power transfer system, switching at least one of a first switch and a second switch in a ground fault detection component upon identification of the ground fault in the DC power transfer system, passing a fault current through at least one of a first resistive element and a second resistive element upon switching the first switch or the second switch respectively to increase a magnitude of the fault current, measuring the fault current at one or more loads upon increasing the magnitude of the fault current using a current sensor operatively coupled to each load, detecting a location of the ground fault based on a measured fault current at each load.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments of the present invention include a system and a method for locating a ground fault in a direct current (DC) power transfer system. The ground fault detection system includes a ground fault detection component and one or more current sensors. The ground fault detection component includes a first switch, a second switch, a first resistive element and a second resistive element. The first switch is electrical coupled to the first resistive element and the second switch is electrically coupled to the second resistive element in a series configuration respectively. The one or more current sensors are operatively coupled to one or more respective loads and are configured to measure a fault current at the respective loads upon switching at least one of the first switch or the second switch to a conducting state. The switching of at least one of the first switch or the second switch to the conducting state enables the fault current to pass through at least one of the first resistive element or the second resistive element. Upon passing the fault current through at least one of the first resistive element and the second resistive element, a magnitude of the fault current increases, which enables the one or more current sensors to measure the fault current at respective loads. Furthermore, a location of the ground fault is detected based on measurement of fault currents at the one or more loads.

Figure 1:
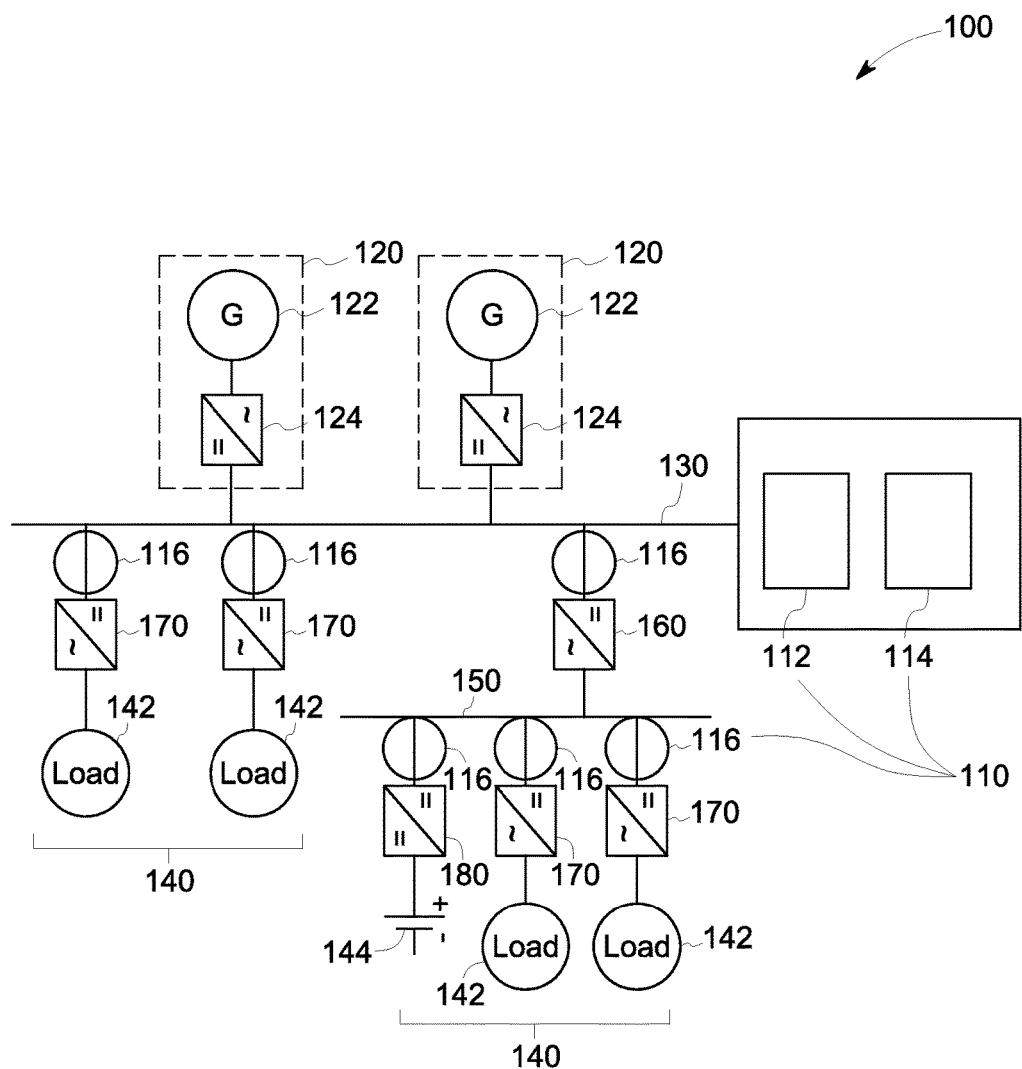
FIG. 1 is a schematic representation of a direct current (DC) power transfer system including a ground fault detection system in accordance with an embodiment of the invention.

FIG. 1 is a schematic representation of a direct current (DC) power transfer system 100 including a ground fault detection system 110 in accordance with an embodiment of the invention. The DC power transfer system 100 includes a direct current (DC) power source 120 operatively coupled to a first DC bus 130. In one embodiment, the DC power source 120 includes an AC power source 122 operatively coupled to a rectifier 124 and the first DC bus 130 is coupled to an output of the rectifier 124. In another embodiment, the DC power transfer system 100 may include a plurality of DC power sources 120. The DC power source 120 generates DC power that is transmitted over the first DC bus 130 to one or more loads 140 operatively coupled to the first DC bus 130. In one embodiment, some of the loads 140 may be operatively coupled to a second DC bus 150 and the second DC bus 150 may be coupled to the first DC bus 130 via a first DC-DC converter 160. In one embodiment, the one or more loads 140 may include alternating current (AC) loads 142 and DC loads 144. In a specific embodiment, the AC loads 142 may include electric motors and DC loads 144 may include energy storage elements such as a battery. The AC loads 142 are operatively coupled to the first DC bus 130 or the second DC bus 150 via an inverter 170. The inverter 170 converts the DC power received from the first DC bus 130 or the second DC bus 150 to AC power and supplies the AC power to respective AC loads 142. Similarly, the DC loads 144 are operatively coupled to the first DC bus 130 or the second DC bus 150 via a second DC-DC converter 180. The DC-DC converter 180 receives the DC power from the first DC bus 130 or the second DC bus 150 and converts the DC power based on respective DC load requirements and supplies the same to the DC loads 144. In one embodiment, the DC power transfer system 100 may include a medium voltage (e.g., 1 KV-10 KV) DC power transfer system. In another embodiment, the DC power transfer system 100 may include a marine vessel DC power transfer system.

Ground faults may occur at one or more loads 140 in the DC power transfer system 100 due to various reasons. Some of the reasons may include reduced insulation, physical damages to an insulation system or excessive transient or steady-state voltage stresses on the insulation system of the DC power transfer system 100. The DC power transfer system 100 includes the ground fault detection system 110 coupled to the first DC bus 130 which detects and locates the ground fault in the DC power transfer system 100 upon occurrence of the ground fault. The ground fault detection system 110 includes a ground fault detection component 112, a DC grounding component 114 and one or more current sensors 116 operatively coupled to one or more loads 140. The DC grounding component 114 is used to provide grounding for the DC power transfer system 100 and also detect the ground fault in the DC power transfer system 100. Furthermore, the ground fault detection component 112 and the one or more current sensors 116 are used to locate an origin of the ground fault. In one embodiment, the DC grounding component 114 and the ground fault detection component 112 may be coupled in parallel to each other. In another embodiment, the ground fault detection component 112 and the DC grounding component 114 may be coupled to the first DC bus 130 at different locations and may or may not have a physical coupling between each other.

Furthermore, upon locating ground faults at one or more loads, the DC power transfer system 100 isolates the one or more faulty loads from the first DC bus 130 using known transmission and networking protocols. In one embodiment, an additional ground fault detection system (not shown) may be coupled to the second DC bus 150 to detect and locate the ground fault within the loads operatively coupled to the second DC bus 150. In another embodiment, the ground fault detection system 110 and the additional ground fault detection system may be configured to either operate independently of each other or in combination to detect and locate the ground fault using suitable means and measures.

Figure 2A:
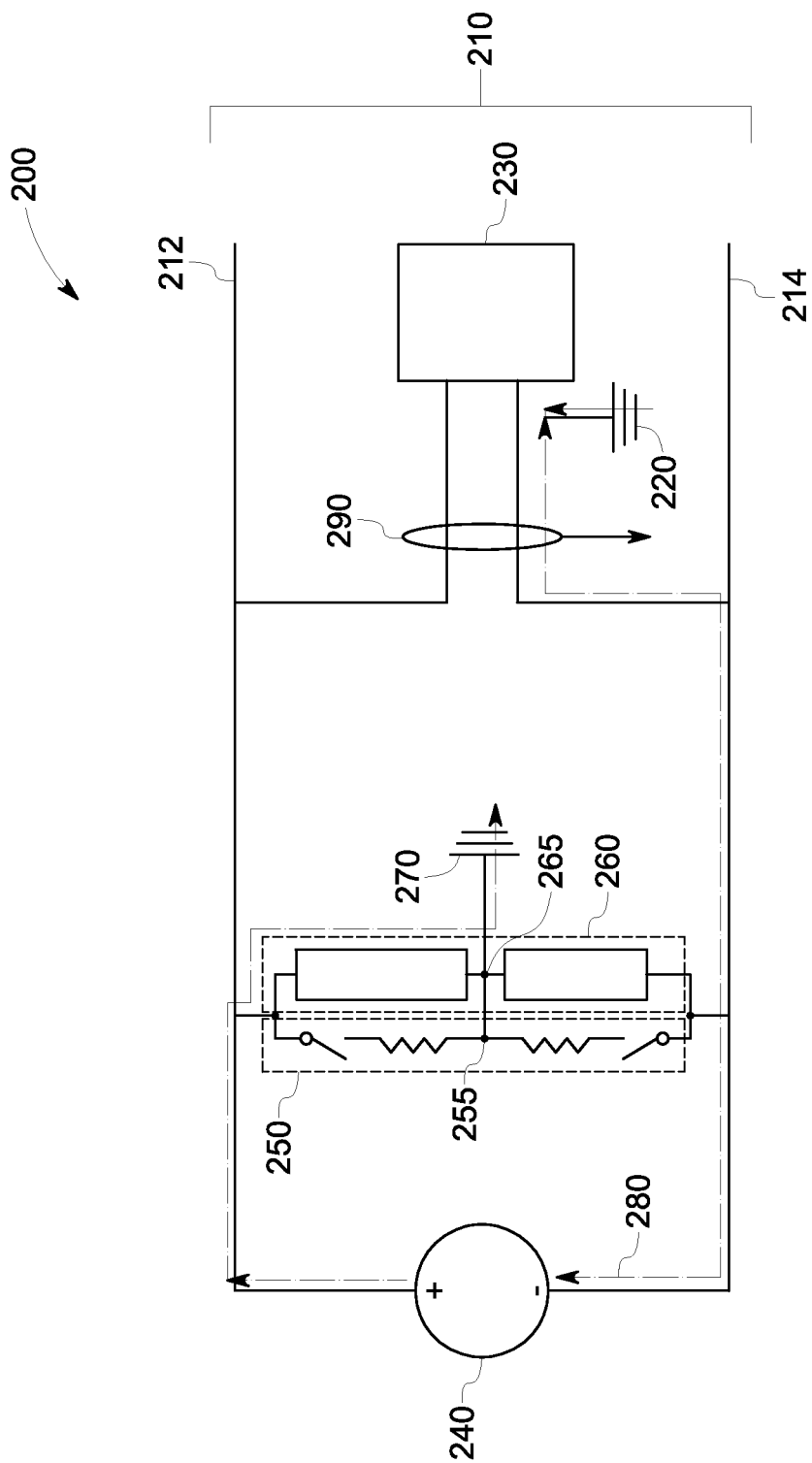
FIG. 2A and FIG. 2B are schematic representations of an exemplary ground fault detection system coupled to a first DC bus and configured to detect and locate a ground fault at a load electrically coupled to the first DC bus in accordance with an embodiment of the invention.
Figure 2B:
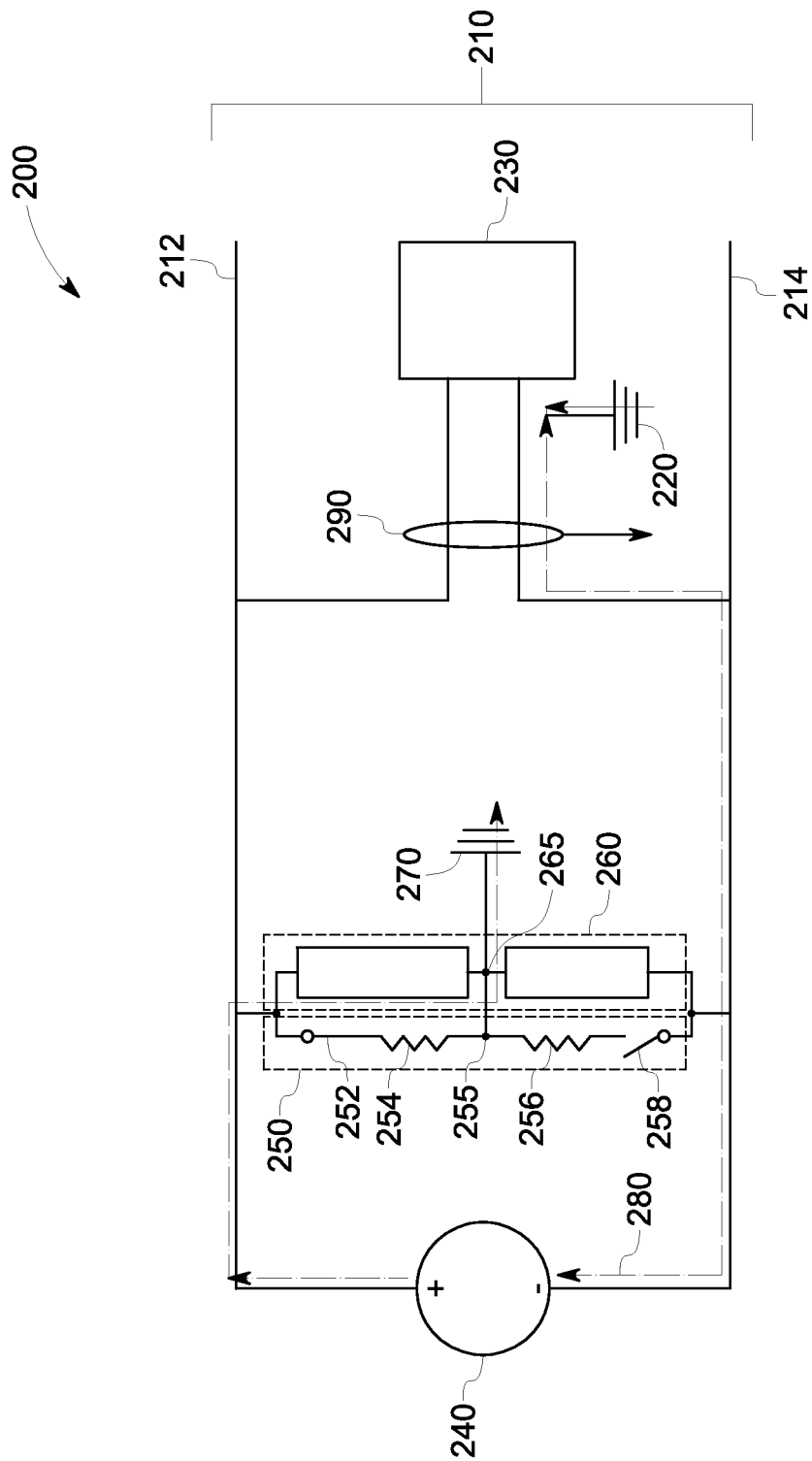

FIGS. 2A and 2B are schematic representations of an exemplary ground fault detection system 200 coupled to a first DC bus 210 and configured to detect and locate a ground fault 220 at a load 230 electrically coupled to the first DC bus 210 in accordance with an embodiment of the invention. The first DC bus 210 is coupled to a power source 240 and includes a positive rail 212 and a negative rail 214. The ground fault detection system 200 includes a ground fault detection component 250 and a DC grounding component 260 electrically coupled to each other in a parallel configuration between the positive rail 212 and the negative rail 214 of the first DC bus 210. Furthermore, the positive rail 212 and the negative rail 214 of the first DC bus 210 are grounded via DC grounding component 260 using known techniques at a neutral point 270 to provide a balanced ground reference voltage. Any known technique that provides a balanced ground reference voltage may be used to form the DC grounding component 260 some of which are described later in the specification. The DC grounding component 260 and the ground fault detection component 250 are coupled to the neutral point 270 at a first midpoint 265 and a second midpoint 255 respectively. Moreover, the load 230 is electrically coupled to the first DC bus 210 via the positive rail 212 and the negative rail 214.

During normal operation, the balanced ground reference voltage in the positive rail 212 and the negative rail 214 is equivalent to a positive DC voltage ($+V_{dc}$) and a negative DC voltage ($-V_{dc}$) with respect to neutral point 270 respectively. Furthermore, the ground fault 220 may occur at the negative rail 214, the positive rail 212, or both. In situations, where the ground fault 220 occurs at the positive rail 212, the voltage in the positive rail 212 which was ($+V_{dc}$) would shift to and the voltage in the negative rail 212 which was ($-V_{dc}$) would shift to $-2V_{dc}$. Similarly, if the ground fault 220 occurs at the negative rail 214, the positive DC voltage ($+V_{dc}$) in the positive rail 212 shifts from $+V_{dc}$ to $+2V_{dc}$ and the negative DC voltage in the negative rail 214 shifts from $-V_{dc}$ to 0. Thus, by measuring the shift in the DC voltage in the positive rail 212 or the shift in the DC voltage in the negative rail 214, the ground fault detection system 200 detects the occurrence of the ground fault 220 in the DC power transfer system (FIG. 1) and also identifies the rail at which the ground fault 220 has occurred.

Furthermore, as shown in FIG. 2A, upon occurrence of the ground fault 220 at the negative rail 214 coupled to the load 230, a fault current represented by arrow 280 is induced in the DC power transfer system of FIG. 1. The fault current 280 forms a loop and flows through from the load 230 via the negative rail 214 through the power source 240, the DC grounding component 260 and reaches the neutral point 270. Such fault current causes the positive DC voltage ($+V_{dc}$) in the positive rail 212 to shift from +$V_{dc}$ to +$2V_{dc}$. The ground fault detection system 200 detects the shift in the DC ground reference voltage and notifies a user or a system controller (not shown). In one embodiment, the DC grounding component 260 may limit the fault current 280 to a predetermined magnitude, which does not require an immediate shut down of the DC power transfer system. The DC grounding component 260 may include various configurations some of which are discussed below.

Figure 3:
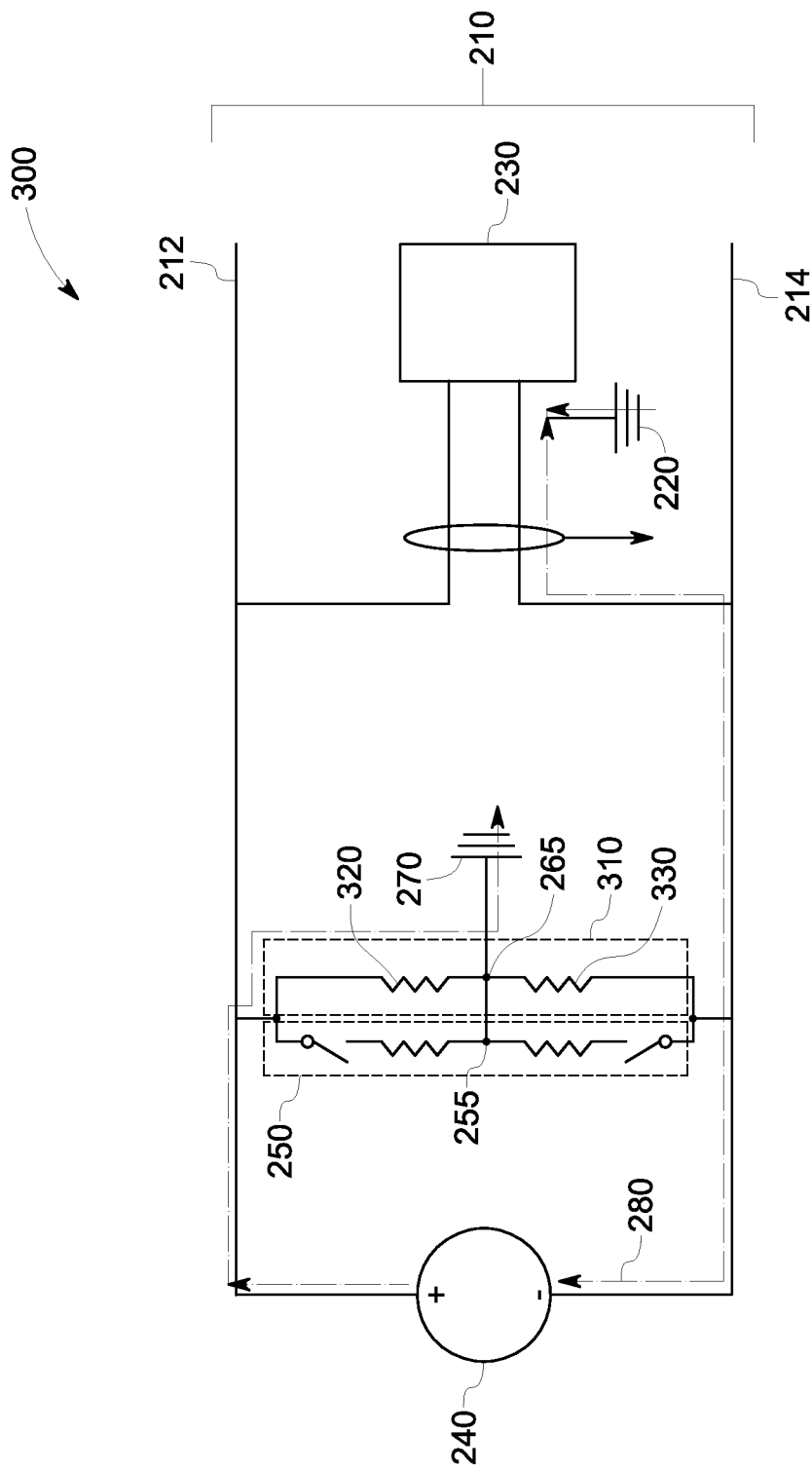
FIG. 3 is a schematic representation of ground fault detection system including a DC grounding component which further includes resistive elements in accordance with an embodiment of the invention.

FIG. 3 is a schematic representation of a ground fault detection system 300 including a DC grounding component 310 which further includes resistive elements 320. The ground fault detection system 300 is substantially similar to the ground fault detection system 200 of FIGS. 2A and 2B having some differences with respect to the DC grounding component 260 of FIGS. 2A and 2B. In this embodiment, a third resistive element 320 and a fourth resistive element 330 are coupled in series to each other such that the midpoint 265 between the third resistive element 320 and the fourth resistive element 330 is coupled to the neutral point 270.

Figure 4:
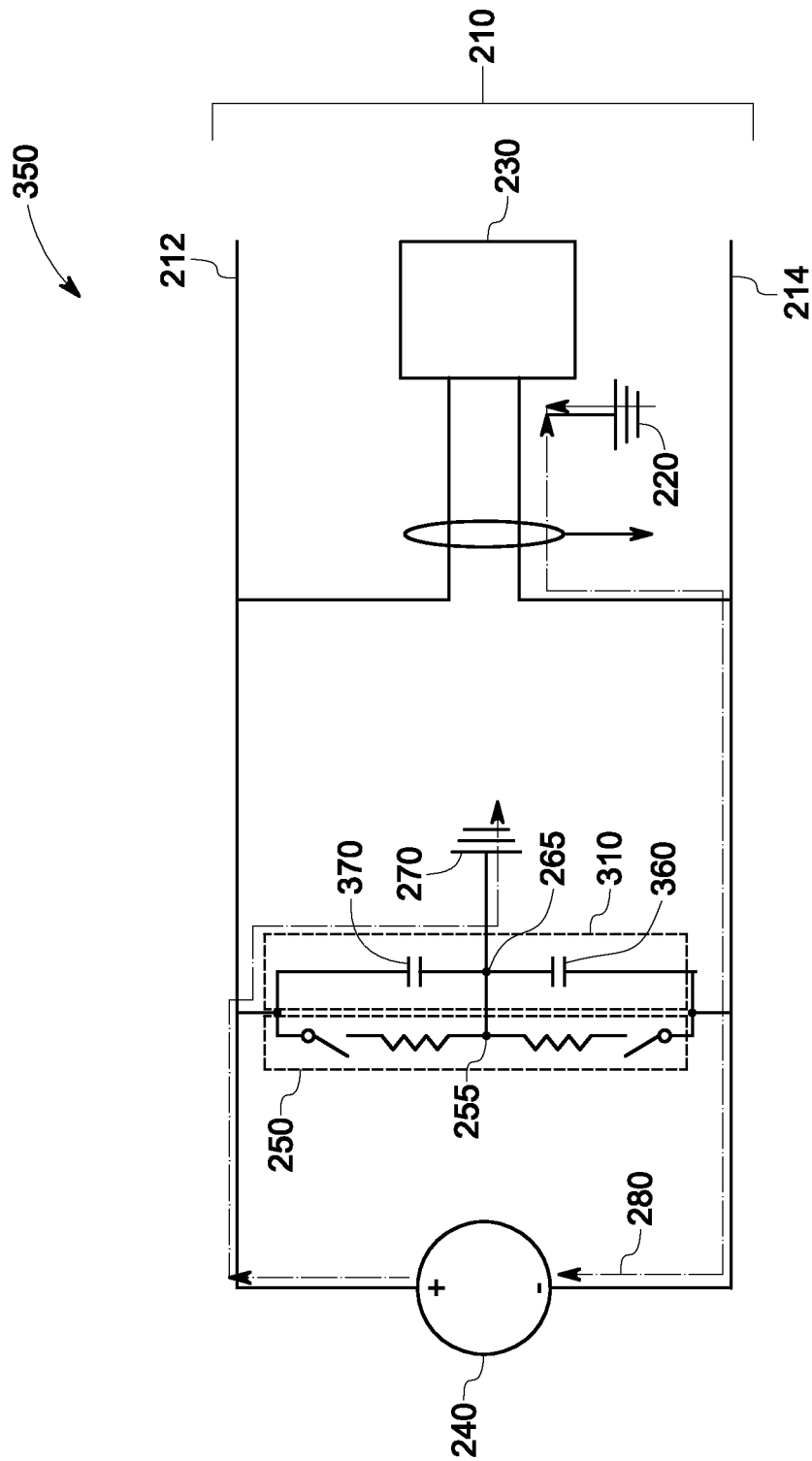
FIG. 4 is a schematic representation of an alternative embodiment of a ground fault detection system including a DC grounding component which further includes a first capacitive element and a second capacitive element in accordance with an embodiment of the invention.

FIG. 4 is a schematic representation of an alternative embodiment of a ground fault detection system 350 including a DC grounding component 360 which further includes a first capacitive element 370 and a second capacitive element 380. The ground fault detection system 350 is substantially similar to the ground fault detection system 200 of FIGS. 2A and 2B having some differences with respect to the DC grounding component 260 of FIGS. 2A and 2B. In this embodiment, the resistive elements 320, 330 of FIG. 3 may be replaced with the first capacitive element 370 and the second capacitive element 380. The first capacitive element 370 and the third capacitive element 380 are coupled in series to each other such that the midpoint 265 between the first capacitive element 370 and the second capacitive element 380 is coupled to the neutral point 270.

With continued reference to FIG. 2A, although, the ground fault is detected in the DC power transfer system (FIG. 1), the location of the load 230 at which the ground fault 220 has occurred is not detected. This is due to the impedance of the DC grounding component 260 which limits the magnitude of the fault current 280 to avoid damages to the DC power transfer system. The magnitude of the fault current 280 flowing through DC grounding component 260 is such that the ground fault detection system 200 is unable to detect the fault current 280 flowing in the DC power transfer system. Therefore, the ground fault detection system 200 uses the ground fault detection component 250 to increase the magnitude of the fault current 280 to a predefined limit which may be detected by the ground fault detection system 200. The ground fault detection system 200 detects the fault current 280 at each load 230 in the DC power transfer system as the fault current 280 will be detected only at the load 230 where the ground fault 220 has occurred. Therefore, the ground fault detection system 200 uses the fault current 280 to detect the location of the ground fault 220 in the DC power transfer system.

With reference to FIG. 2B, upon detection of the ground fault 220 by the DC grounding component 260, the ground fault detection system 200 locates the load 230 at which the ground 220 fault has occurred. To this end, the ground fault detection system 200 includes the ground fault detection component 250 and one or more current sensors 290 operatively coupled to the load 230. The ground fault detection component 250 includes a first switch 252 electrically coupled in series to a first resistive element 254 above the midpoint 255 of the ground fault detection component 250 and a second switch 256 electrically coupled in series to a second resistive element 258 below the midpoint 255 of the ground fault detection component 250. In one embodiment, the first switch 252 and the second switch 256 may include a mechanical switch or a semiconductor switch.

The ground fault detection component 250 is designed such that a detector impedance of the ground fault detection component 250 is smaller than the impedance of the DC grounding component 260. The detector impedance is chosen such that the fault current 280, when diverted to flow from the ground fault detection component 250 increases the magnitude of the fault current 280 to the predefined limit which is measurable by the ground fault detection system 200. To this end, at least one of the first switch 252 and the second switch 256 may be switched to a conducting state. In situations, where the ground fault 220 is detected on the negative rail 214 of the first DC bus 210, the first switch 252 is switched to the conducting state, or if the ground fault is detected on a positive rail 212 of the first DC bus 210, the second switch 256 is switched to the conducting state. Furthermore, if the ground fault has occurred at the positive rail 212 and the negative rail 214, the first switch 252 and the second switch 256 are switched to the conducting state simultaneously.

In this example, since the ground fault has occurred at the negative rail 214, the first switch 252 is switched to the conducting state. Such switching of the first switch 252 enables the fault current 280 to pass through the first resistive element 254 which has an impedance lower than the DC grounding component 260, for example, the third resistive element 320 of FIG. 3. For example, in a medium voltage DC power transfer system (e.g., 1 KV-10 KV), the third resistive element 320 and the fourth resistive element 330 (FIG. 3) of the DC grounding component 260 of FIG. 3 are chosen such that the fault current 280 does not exceed one ampere, then the first resistive element 254 and the second resistive element 258 are chosen such that fault current 280 may increase up to ten amperes. Therefore, passing the fault current 280 through the first resistive element 254 instead of the DC grounding component 260 increases the magnitude of the fault current 280 which is measurable by the one or more current sensor 290. In one embodiment, the first switch 252 and the second switch 258 may be configured to, continuously switch based on a predefined switching pattern during the operations of the DC power transfer system to detect the location of the ground fault 220 in the DC power transfer system. To this end, the first switch 252 and the second switch 258 may be switched continuously based on the predefined switching pattern to generate an alternating around current, or a direct ground current. Furthermore, an output waveform of the alternating ground current or the direct ground current may be monitored to detect any deviations from a predefined output waveform. Any deviation from the predefined output waveform may represent a ground fault 220 and since the first switch 252 and the second switch 258 are being switched continuously, the one or more current sensors 290 at each load 230 may measure the fault current 280 at each of the loads 230 to determine the location of the ground fault 220. In such an embodiment, the one or more current sensors 290 may include a current transformer.

The aforementioned process to measure the fault current 280 at the load 230 can be applied to a plurality of loads, wherein each load is operatively coupled to a current sensor as shown in FIG. 1. Since each load is operatively coupled to a respective current sensor, passing the fault current through at least one of the first resistive element and the second resistive element enables each current sensor to measure the fault current at respective loads. Subsequently, the loads at which the current sensor measures the fault current are identified as faulty loads and such faulty loads are isolated from the DC power transfer system.

Figure 5:
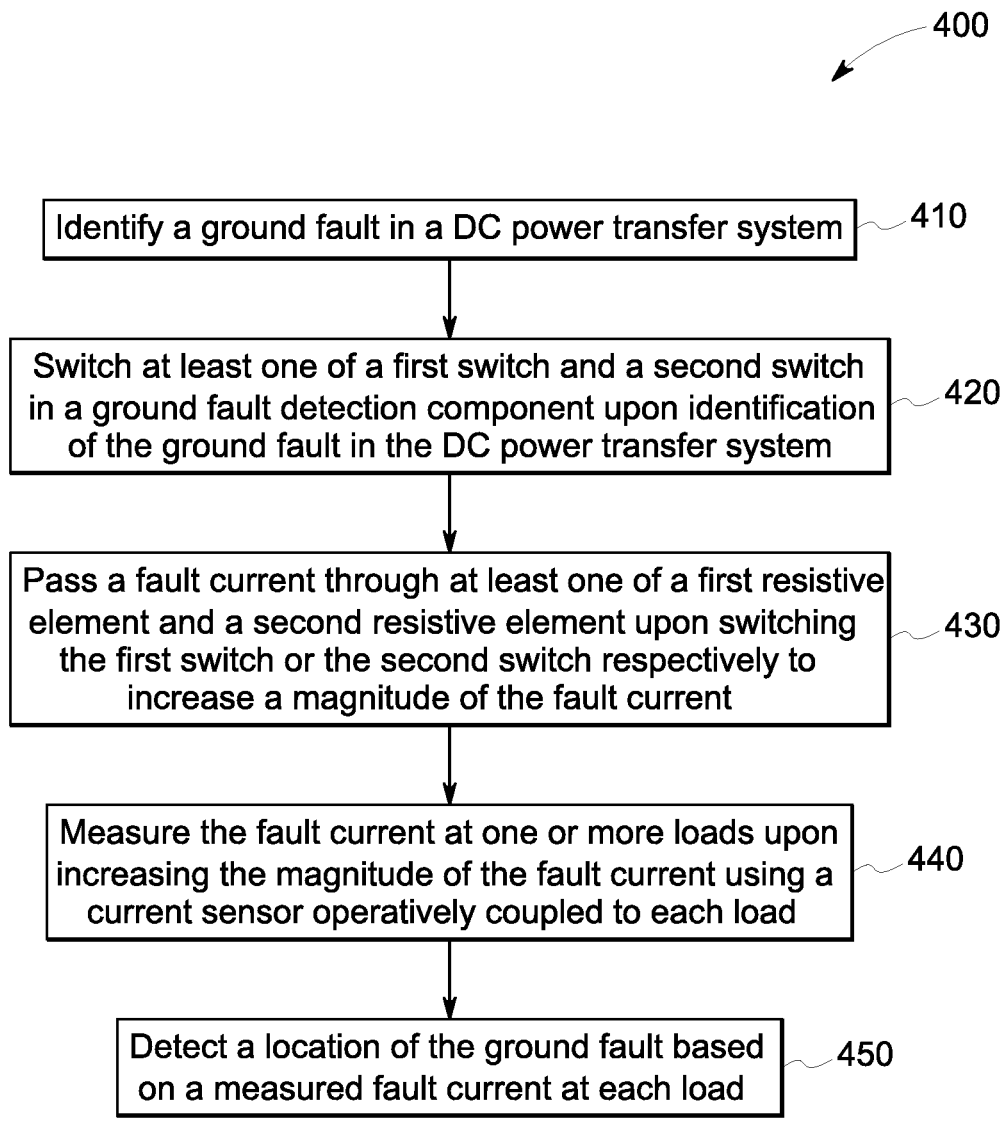
FIG. 5 is a flow chart representing steps involved in a method for detecting and locating a ground fault in a DC power transfer system in accordance with an embodiment of the invention.

FIG. 5 is a flow chart representing steps involved in a method 400 for detecting and locating a ground fault in a DC power transfer system in accordance with an embodiment of the invention. The method 400 includes identifying a ground fault in a DC power transfer system in step 410. The method 400 also includes switching at least one of a first switch and a second switch in a ground fault detection component upon identification of the ground fault in the DC power transfer system in step 420. In one embodiment, the first switch and the second switch are continuously switched based on a predefined switching pattern. In another embodiment, the first switch is switched upon occurrence of the ground fault on a negative rail of a DC bus and the second switch is switched upon occurrence of the ground fault on a positive rail of the DC bus. In yet another embodiment, at least one of the first switch or the second switch are switched at a fixed frequency to generate an alternating ground current or a direct ground current and the alternating ground current or the DC ground current is measured using a current transformer to detect a location of the ground fault. The method 400 further includes passing a fault current through at least one of a first resistive element and a second resistive element upon switching the first switch or the second switch respectively to increase a magnitude of the fault current in step 430. The method 400 also includes measuring the fault current at one or more loads upon increasing the magnitude of the fault current using a current sensor operatively coupled to each load in step 440. The method 400 further includes detecting a location of the ground fault based on a measured fault current at each load in step 450. In one embodiment, the method 400 further includes isolating the load corresponding to a detected location of the ground fault from a DC bus in the DC power transfer system.

It is to be understood that a skilled artisan will recognize the interchangeability of various features from different embodiments and that the various features described, as well as other known equivalents for each feature, may be mixed and matched by one of ordinary skill in this art to construct additional systems and techniques in accordance with principles of this disclosure. It is, therefore, to be understood that the appended claims are intended to cover all such modifications and changes as fall within the true spirit of the invention.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A ground fault detection system for locating a ground fault in a direct current (DC) power transfer system comprising:
   a ground fault detection component comprising:
   a first switch and a second switch;
   a first resistive element and a second resistive element;
   wherein, the first switch is electrically coupled to the first resistive element and the second switch is electrically coupled to the second resistive element in a series configuration respectively,
   a current sensor operatively coupled to a load and configured to measure a fault current at the load upon switching at least one of the first switch or the second switch to a conducting state; and
   a DC grounding component coupled to the ground fault detection component in a parallel configuration between a positive rail and a negative rail of a first DC bus, wherein the DC grounding component is configured to provide a balanced ground reference voltage at a neutral point;
   wherein the DC grounding component comprises a third resistive element and a fourth resistive element, a first capacitive element and a second capacitive element, or a combination thereof for providing the balanced ground reference voltage.

2. The ground fault detection system of claim 1, wherein the first switch and the second switch comprises a mechanical switch or a semiconductor switch.

3. The ground fault detection system of claim 1, wherein a grounding impedance of the DC grounding component is higher than a detector impedance of the ground fault detection component.

4. The ground fault detection system of claim 1, wherein the first switch is switched to a conducting state upon occurrence of the ground fault on a negative rail of a DC bus in the DC power transfer system and the second switch is switched upon occurrence of the ground fault on a positive rail of the DC bus in the DC power transfer system.

5. The ground fault detection system of claim 1, wherein the first switch and the second switch are configured to switch continuously based on a predefined switching pattern to locate the ground fault in the DC power transfer system.

6. A direct current (DC) power transfer system comprising:
   a power source configured to provide DC power,
   a DC bus configured to transmit DC power from the power source;
   at least one load operatively coupled to the DC bus;
   a ground fault detection system operatively coupled to the DC bus comprising:
   a ground fault detection component comprising:
   a first switch and a second switch;
   a first resistive element and a second resistive element;
   wherein, the first switch is electrically coupled to the first resistive element and the second switch is electrically coupled to the second resistive element in a series configuration respectively;
   at least one current sensor operatively coupled to the at least one load and configured to measure a fault current at the at least one load upon switching at least one of the first switch or the second switch to a conducting state; and
   a DC grounding component coupled to the ground fault detection component in a parallel configuration between a positive rail and a negative rail of the DC bus, wherein the DC grounding component is configured to provide a balanced ground reference voltage at a neutral point;
   wherein the DC grounding component comprises a third resistive element and a fourth resistive element, a first capacitive element and a second capacitive element, or a combination thereof for providing the balanced ground reference voltage.

7. The DC power transfer system of claim 6, wherein the first switch is switched to a conducting state upon occurrence of the ground fault on a negative rail of the DC bus in the DC power transfer system and the second switch is switched upon occurrence of the ground fault on a positive rail of the DC bus in the DC power transfer system.

8. The DC power transfer system of claim 6, wherein a grounding impedance of the DC grounding component is higher than a detector impedance of the ground fault detection component.

9. The DC power transfer system of claim 6, wherein the first switch and the second switch are configured to switch continuously based on a predefined switching pattern to locate the ground fault in the DC power transfer system.

10. The DC power transfer system of claim 6, wherein at least one load comprises an electric motor, an energy storage element or a combination thereof.

11. The DC power transfer system of claim 6, wherein the current sensor comprises a current transformer.

12. A method comprising:
  identifying a ground fault in a DC power transfer system;
  switching at least one of a first switch and a second switch in a ground fault detection component upon identification of the ground fault in the DC power transfer system;
  passing a fault current through at least one of a first resistive element and a second resistive element upon switching the first switch or the second switch respectively to increase a magnitude of the fault current;
  measuring the fault current at one or more loads upon increasing the magnitude of the fault current using a current sensor operatively coupled to each load; and
  detecting a location of the ground fault based on a measured fault current at each load;
  wherein a balanced ground reference voltage is provided to the ground fault detection component at a neutral point by a DC grounding component coupled to the ground fault detection component in a parallel configuration between a positive rail and a negative rail of a first DC bus; and
  wherein the DC grounding component comprises a third resistive element and a fourth resistive element, a first capacitive element and a second capacitive element, or a combination thereof for providing the balanced ground reference voltage.

13. The method of claim 12, further comprising switching the first switch and the second switch continuously based on a predefined switching pattern.

14. The method of claim 12, wherein switching at least one of the first switch or the second switch comprises switching the first switch upon occurrence of the ground fault on a negative rail of a DC bus in the DC power transfer system and switching the second switch upon occurrence of the ground fault on a positive rail of the DC bus in the DC power transfer system.

15. The method of claim 12, further comprising switching at least one of the first switch or the second switch at a fixed frequency to generate an alternating ground current or a direct ground current and measuring the alternating ground current or the direct ground current using a current transformer to detect the location of the ground fault.

16. The method of claim 12, further comprising isolating the load corresponding to a detected location of the ground fault from a DC bus in the DC power transfer system.

* * * * *